United States Patent
Gaibotti et al.

[11] Patent Number: 6,133,621
[45] Date of Patent: Oct. 17, 2000

[54] INTEGRATED SHIELDED ELECTRIC CONNECTION

[75] Inventors: Maurizio Gaibotti, Cesano Maderno; Marco Costanzo, Mitello Val Di Catania; Francesco Sorrentino, Catania, all of Italy

[73] Assignee: STMicroelectronics S.r.l., Agrate Brianza, Italy

[21] Appl. No.: 09/222,643

[22] Filed: Dec. 30, 1998

[51] Int. Cl.[7] .................................................. H01L 29/41
[52] U.S. Cl. ........................................... 257/659; 257/664
[58] Field of Search ..................................... 257/659–664

[56] References Cited

U.S. PATENT DOCUMENTS

| | | | |
|---|---|---|---|
| 4,626,889 | 12/1986 | Yamamoto et al. | 257/664 |
| 4,673,904 | 6/1987 | Landis . | |
| 5,288,949 | 2/1994 | Crafts . | |
| 5,309,015 | 5/1994 | Kuwata et al. | 257/659 |
| 5,338,897 | 8/1994 | Tsay et al. . | |
| 5,357,138 | 10/1994 | Kobayashi | 257/664 |
| 5,729,047 | 3/1998 | Ma | 257/664 |
| 5,811,882 | 9/1998 | Latham, IV et al. | 257/776 |

FOREIGN PATENT DOCUMENTS

| | | |
|---|---|---|
| 2 286 286 | 8/1995 | United Kingdom . |
| WO 97/35344 | 9/1997 | WIPO . |

*Primary Examiner*—David Hardy
*Attorney, Agent, or Firm*—Theodore E. Galanthay; Allen, Dyer, Doppelt, Milbrath & Gilchrist, P.A.

[57] ABSTRACT

A shielded electrical connection of the integrated type comprises a connection element and a shielding element. The connection element includes a first substantially planar structure of a first conducting material and is placed vertically above and isolated from a semiconductor substrate and which occupies a first flat region. The shielding element includes a second substantially planar structure of a second conducting material and is placed vertically between the first structure and the substrate and which occupies a second flat region. A third substantially planar structure made of a third conducting material is placed vertically above the first structure and which occupies a third flat region. The first region does not extend outside the second and third regions. Furthermore, the second and third structures are connected electrically together and to a reference of potential and are electrically insulated from the first structure and the substrate.

37 Claims, 3 Drawing Sheets

INTEGRATED SHIELDED ELECTRIC CONNECTION

FIELD OF THE INVENTION

This invention relates to electrical connections, and more particularly, to a shielded electrical connection of the integrated type.

BACKGROUND OF THE INVENTION

A very large number of electrical connections may be found inside an integrated circuit. These are formed from conducting materials (such as polysilicon and aluminium) and used for propagating a variety of electrical signals, including power supplies voltages and ground.

Within an integrated circuit, the electric and electromagnetic couplings (between connections, the substrate, and logic and/or analog circuit sections) are quite high due to the very short distances. The couplings may originate noise in the electrical signals. These couplings and the attendant noise must be taken into proper account in the design of the integrated circuit, which is not easily accomplished.

SUMMARY OF THE INVENTION

It is an object of this invention to provide an electrical connection, adapted to be formed within an integrated circuit, which is less affected by electric and/or electromagnetic couplings and more immune to electric and/or electromagnetic noise.

This object is achieved by an electrical connection comprising a conventional type of connection element, and a shielding element including two structures of a conducting material which substantially surround it. This provides good shielding. The electrical connection according to this invention is specially advantageous where d.c. voltage reference signals are to be propagated. In this way, in fact, the capacitive coupling between the connection element and the shielding element can become advantageous.

BRIEF DESCRIPTION OF THE DRAWINGS

The invention can be better understood by reading the following description in conjunction with the accompanying drawings, wherein electric connections according to the invention are shown and.

DETAILED DESCRIPTION OF THE PREFERRED EMBODIMENTS

Figure 1:
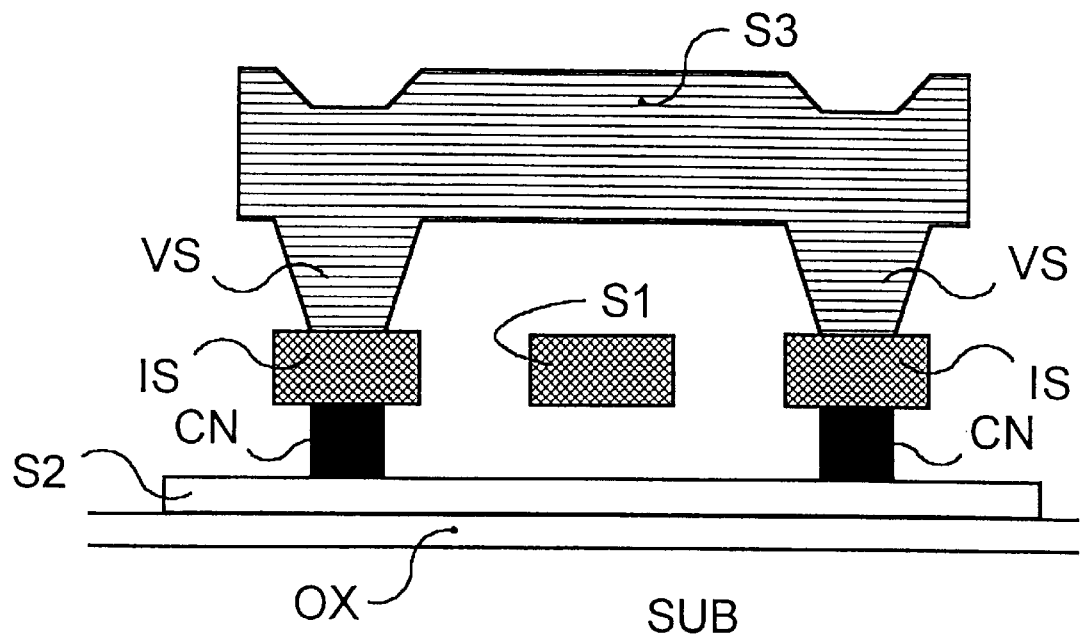
FIG. 1 is a vertical cross-section through a first connection.

Referring to FIG. 1, a shielded electrical connection of the integrated type according to this invention comprises a connection element including a first planar structure S1 made of a first conducting material which is placed vertically onto and isolated from a semiconductor substrate SUB and occupies a first flat region. It also comprises a shielding element including:

a) a second planar structure S2 of a second conducting material, which is placed vertically between the structure S1 and the substrate SUB and occupies a second flat region; and b) a third planar structure S3 of a third conducting material, which is placed vertically above the structure S1 and occupies a third flat region.

These structures are arranged such that the first region is not located outside the second and the third regions. In other words, the first region is confined within the second and third regions. In addition, the structures S2 and S3 are connected electrically together and to a reference potential, and are insulated electrically from both the structure S1 and the substrate SUB. The insulation between the structure S2 and the substrate SUB may be provided, as shown in FIG. 1, by a layer OX of silicon oxide having a suitable thickness. Thus, a complex sandwich structure is obtained wherein the connection element is on the inside and substantially surrounded by the shielding element. This provides good shielding by itself.

Planar structures have been mentioned before. Of course, this expression should not be taken in a geometrical sense, but always referred to the limitations from the fabrication process and typical technological practice. In a standard integrated circuit fabrication process, the structure S2 may be formed from polysilicon, for example, in the first polysilicon layer poly1 (i.e., the one next to the substrate).

It is instead highly advantageous, with regards to the resistivity of the elements and shielding capacity, that the structures S1 and S3 be both provided of a metal material and formed respectively in the first metal layer metal1 (i.e., that nearest the substrate) and the second metal layer metal2. This case is, in fact, illustrated by the example of FIG. 1, wherein the thickness of the layer poly1 is about 0.2 μm, that of the layer metal1 is about 0.5 μm, and that of the layer metal2 is about 1.0 μm.

Where a more complex process is available, providing more than two metallization levels, all structures of the connection may be made of a metal material. In particular, the structures S1, S2, S3 may be formed respectively in the layers metal2, metal1, metal3, for example. This results in a less resistive shielding element and provides improved shielding of the connection element in the vertical direction, especially from the substrate SUB.

To improve somewhat the shielding of the connection element in the sideways or lateral direction, the metal layer comprising the structure S3 may be bent along its peripheral portions toward the substrate SUB, and thus brought closer to the structure S2. Accordingly, the shielding element can surround the connection element more completely.

Figure 2:
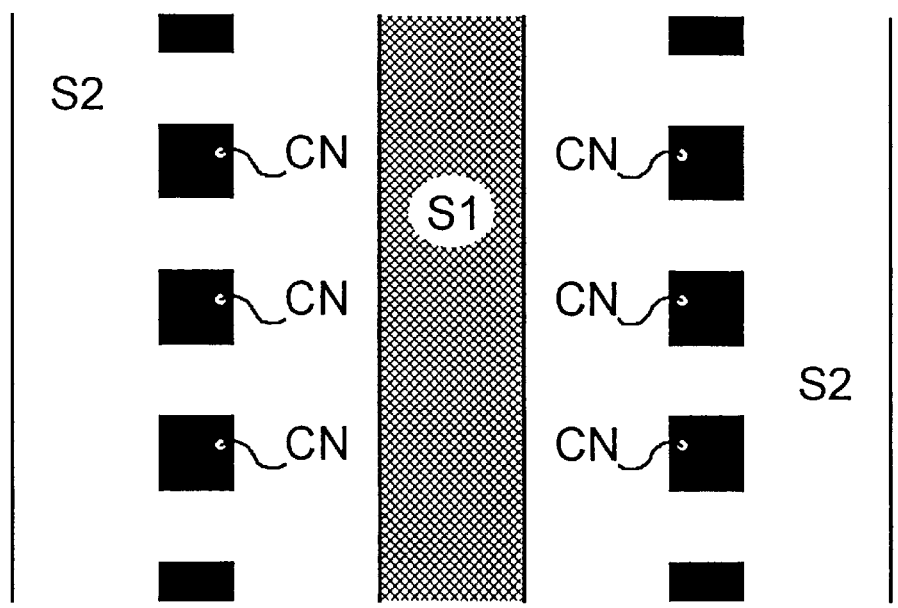
FIG. 2 is a first possible horizontal cross-section through the first connection.
Figure 3:
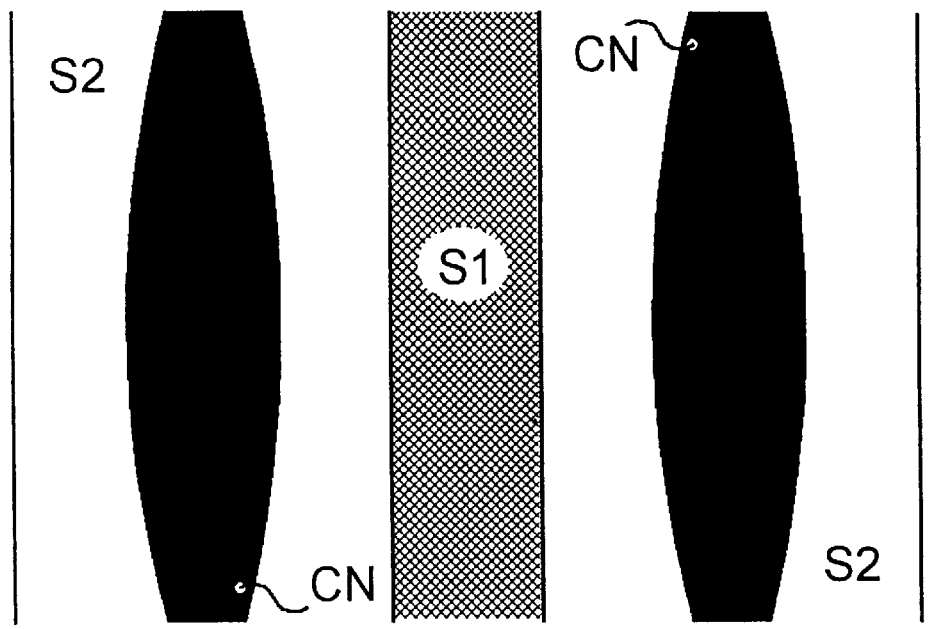
FIG. 3 is a second possible horizontal cross-section through the first connection.

To further enhance the shielding of the connection element in the sideways direction, the structures S2 and S3 may be arranged to contact each other along peripheral portions of their respective regions, as shown schematically in FIG. 2 or FIG. 3, for example.

FIG. 1 illustrates, for example, how this contact between the structures S2 and S3 can be provided in a practical way. Laid alongside the structure S1 are two intermediate structures IS of a metal material, also formed in the first metal layer metal1. The structure S3 is placed in contact with the structures IS by vias VS, that is, openings are made above the structures IS and the metal layer metal2 is deposited such that the metal fills the openings while forming the structure S3. The structures IS are placed in contact with the structure S2 by contacts CN, that is, openings are made above the structure S2 and filled with a metal material such as tungsten. Ultimately the metal layer metal1 is deposited to concurrently form the structure S1 and the structures IS.

The contacting may be continuous along the illustrated length, as in FIG. 3. Alternatively, spot contacting may be provided as in FIG. 2. Continuous contacting provides better side shielding, but requires more space because the contacts CN tend to spread out as they grow in length, as shown in FIG. 3. Spot contacting, on the other hand, requires less space and provides an acceptable amount of shielding for most applications, if the spacing of the contacts CN is sufficiently small, as shown in FIG. 2. If the contacting form of FIG. 1 is selected, i.e. intermediate structures are employed, the structures IS may be made continuous for the benefit of sideways shielding, and the contacts CN may be either continuous or spot-like, as explained before.

Figure 4:
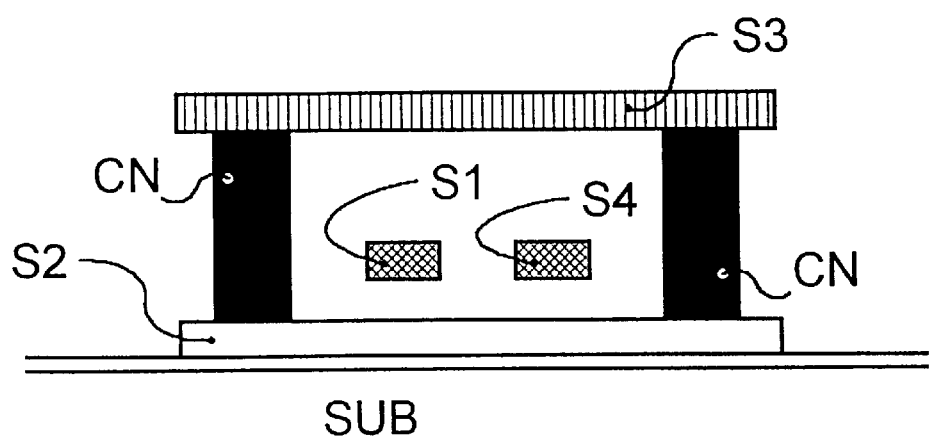
FIG. 4 is a vertical cross-section through a second connection.

The connection of this invention may include more than one connection element. For example, the connections shown in FIG. 4 and FIG. 5 comprise another connection element including a fourth planar structure S4, of the same material as the structure S1 and coplanar therewith, which occupies a fourth flat region. This fourth region is outside neither the second nor the third region, and lies outside the first region. In addition, the structure S4 is insulated electrically from the structures S1, S2, S3.

Figure 5:
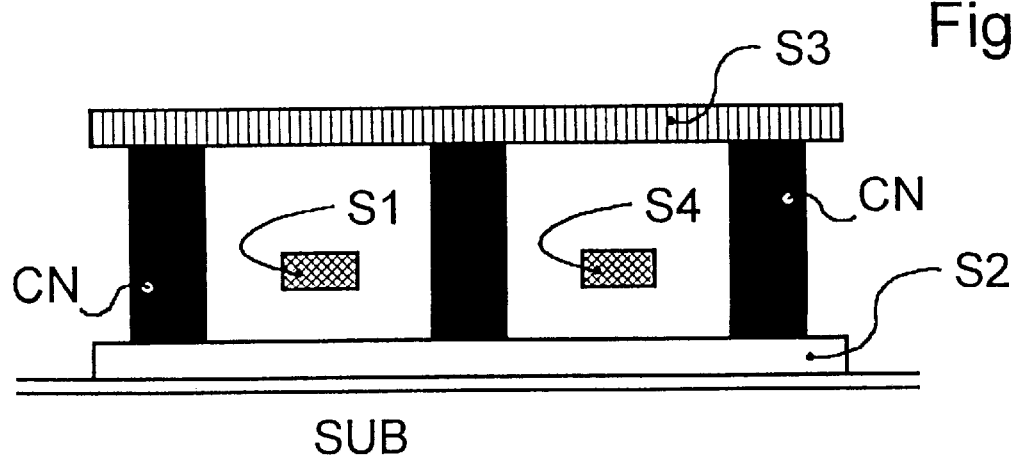
FIG. 5 is a vertical cross-section through a third connection.

If the connection elements have to be shielded from one another, the structures S2 and S3 can be suitably contacted with each other as shown in FIG. 5. Of course, an electrical connection is expected to include contact zones where the electrical signal to be propagated can be injected or extracted.

Figure 6A:
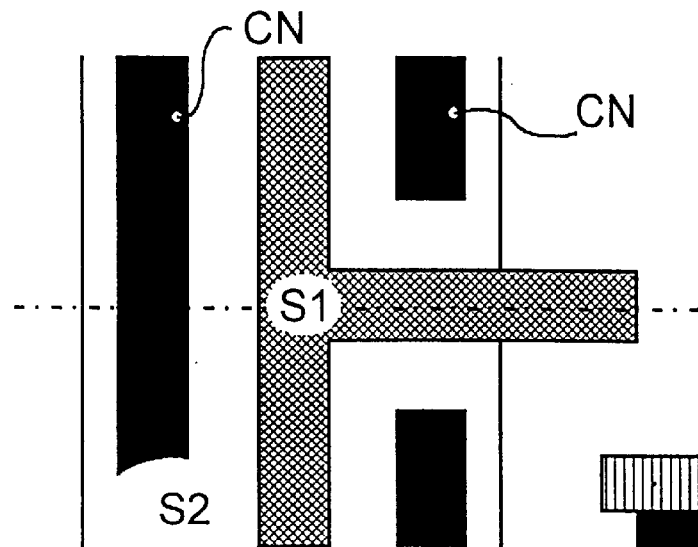
FIG. 6A is a horizontal cross-section taken through the first connection at a contact zone thereof.
Figure 6B:
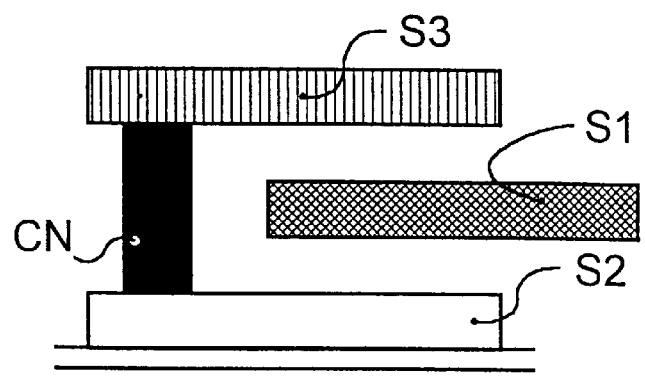
FIG. 6B is a vertical cross-section taken through the first connection at a contact zone thereof.

In the contact zones of the connection according to the invention, the edge of a region corresponding to a connection element matches the edge of the second and/or third region, as shown in FIG. 6 or FIG. 7. In other words, the structure S1 juts out of the complex sandwich structure (see in particular FIGS. 6A and 6B).

Figure 7A:
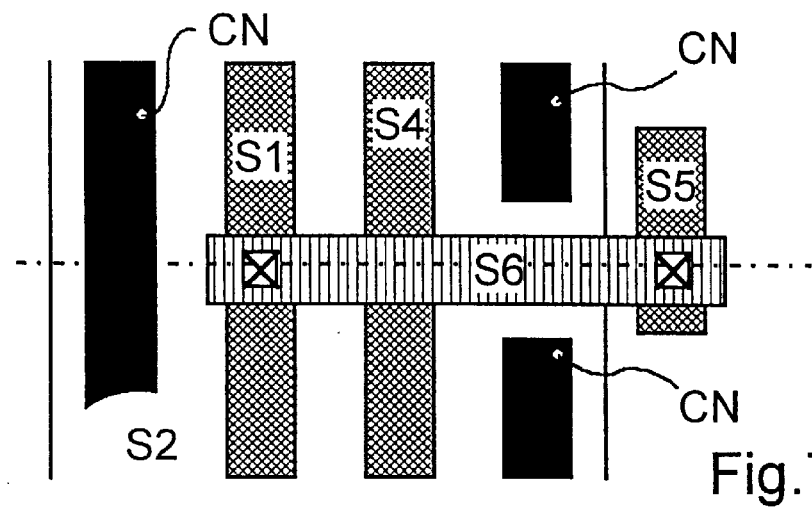
FIG. 7A is a horizontal cross-section taken through the second connection at a contact zone thereof.
Figure 7B:
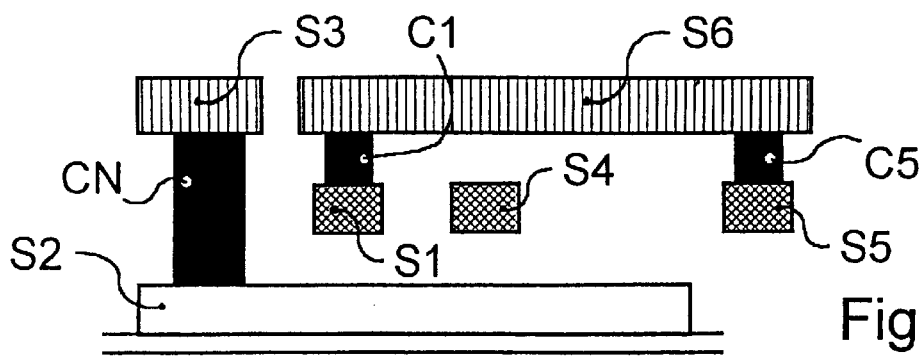
FIG. 7B is a vertical cross-section taken through the second connection at a contact zone thereof.

It could happen, especially where more than one connection element are provided, that a connection element is impossible to extend without causing undesired contacts. This is the case with a rightward extension of the structure S1 in FIG. 4. One solution to the problem is illustrated in FIG. 7A and FIG. 7B, and includes jumping over the interfering structures.

Where the structure S1 is to be placed in contact with a structure S5 formed in the layer metal1, a structure S6 of a metal material formed in the layer metal2, but isolated from the structure S3 is provided. A contact C1 is used to make the structure S1 contact the structure S6, and a contact C5 is used to make the structure S5 contact the structure S6. Thus, the structure S4 is overpassed from above with a low-resistivity material and for a limited loss in shielding power.

The shielded electrical connections of this invention can be used to advantage within integrated circuits to propagate electrical signals therein at high noise immunity. In particular, they are suitable for propagation of a d.c. voltage reference. Such connections exhibit a high capacitive coupling between the connection element and the shielding element so that, if the shielding element is connected to the ground of the signal to be propagated, any ripples in that ground will reflect in the signal to be propagated and their difference remain constant. One application for this propagation could be, by way of non-limitative example, the distribution of the voltage supplied from a single generator of the bandgap type to several circuit blocks within the same integrated circuit.

That which is claimed is:

1. An integrated shielded electrical connection comprising:
    a semiconductor substrate;
    a connection element including a first planar structure of a first conducting material placed vertically above and isolated from said semiconductor substrate and occupying a first flat region; and
    a shielding element comprising
        a second planar structure of a second conducting material placed vertically between said first planar structure and said substrate and occupying a second flat region, and
        a third planar structure of a third conducting material placed vertically above said first planar structure and occupying a third flat region;
    said first flat region being confined within said second and third flat regions, said second and third planar structures being spot electrically connected together along peripheral portions thereof to laterally shield said connection element, said second and third planar structures being electrically insulated from said first planar structure and from said substrate.

2. An integrated shielded electrical connection according to claim 1, wherein said second conducting material comprises polysilicon, and wherein said first and third conducting materials comprise a metal.

3. An integrated shielded electrical connection according to claim 1, wherein said first, second and third conducting materials comprise metal.

4. An integrated shielded electrical connection according to claim 1, further comprising at least one other connection element including a fourth planar structure made of said first conducting material being coplanar with said first planar structure and occupying a fourth flat region; wherein said fourth flat region is confined within said second and third flat regions and extends outside said first flat region; and wherein said fourth planar structure is electrically insulated from said first, second, and third planar structures.

5. An integrated shielded electrical connection according to claim 4, wherein said connection elements are shielded laterally from one another.

6. An integrated shielded electrical connection according to claim 1, further comprising contacting zones wherein an edge of a corresponding flat region to a connection element matches an edge of one of said second and third flat regions.

7. An integrated shielded electrical connection according to claim 1, further comprising a layer of insulating material positioned between said substrate and said second planar structure.

8. An integrated shielded electrical connection according to claim 7, wherein said insulating material comprises an oxide.

9. An integrated shielded electrical connection according to claim 1, further comprising insulating material surrounding said connection element.

10. An integrated shielded electrical connection on a substrate and comprising:
    a connection element including a first structure of a first conducting material placed vertically above and isolated from the substrate and occupying a first region; and
    a shielding element comprising
        a second structure of a second conducting material placed vertically between said first structure and said substrate and occupying a second region, and a third structure of a third conducting material placed vertically above said first structure and occupying a third region;

said first region being confined within said second and third regions, said second and third structures being spot electrically connected together along peripheral portions thereof to laterally shield said connection element, and said second and third structures being electrically insulated from said first structure and from the substrate.

11. An integrated shielded electrical connection according to claim 10, wherein said first, second and third structures are generally planar.

12. An integrated shielded electrical connection according to claim 10, wherein said first, second and third regions are generally flat.

13. An integrated shielded electrical connection according to claim 10, wherein said second conducting material comprises polysilicon, and wherein said first and third conducting materials comprise a metal.

14. An integrated shielded electrical connection according to claim 10, wherein said first, second and third conducting materials comprise metal.

15. An integrated shielded electrical connection according to claim 10, further comprising at least one other connection element including a fourth structure made of said first conducting material being aligned with said first structure and occupying a fourth region; wherein said fourth region is confined within said second and third regions and extends outside said first region; and wherein said fourth structure is electrically insulated from said first, second, and third structures.

16. An integrated shielded electrical connection according to claim 15, wherein said connection elements are shielded laterally from one another.

17. An integrated shielded electrical connection according to claim 10, further comprising contacting zones wherein an edge of a corresponding region to a connection element matches an edge of one of said second and third regions.

18. An integrated circuit comprising:
    a substrate and at least one shielded electrical connection thereon, said at least one shielded electrical connection comprising
        a connection element including a first structure of a first conducting material placed vertically above and isolated from said substrate and occupying a first region, and
        a shielding element comprising a second structure of a second conducting material placed vertically between said first structure and said substrate and occupying a second region, and a third structure of a third conducting material placed vertically above said first structure and occupying a third region;
        said first region being confined within said second and third regions, said second and third structures being spot electrically connected together along peripheral portions thereof to laterally shield said connection element, and said second and third structures being electrically insulated from said first structure and from the substrate.

19. An integrated circuit according to claim 18, wherein said first, second and third structures are generally planar.

20. An integrated circuit according to claim 18, wherein said first, second and third regions are generally flat.

21. An integrated circuit according to claim 18, further comprising at least one other connection element including a fourth structure made of said first conducting material being aligned with said first structure and occupying a fourth region; wherein said fourth region is confined within said second and third regions and extends outside said first region; and wherein said fourth structure is electrically insulated from said first, second, and third structures.

22. An integrated circuit according to claim 21, wherein said connection elements are shielded laterally from one another.

23. An integrated circuit according to claim 18, further comprising contacting zones wherein an edge of a corresponding region to a connection element matches an edge of one of said second and third regions.

24. An integrated circuit according to claim 18, wherein said connection element is connected for propagating at least one electrical signal therein at high noise immunity.

25. An integrated circuit according to claim 24, wherein said electrical signal is a d.c. voltage reference signal.

26. A method for making an integrated shielded electrical connection on a substrate and comprising:
    forming a connection element including a first structure of a first conducting material placed vertically above and isolated from the substrate and occupying a first region; and
    forming a shielding element surrounding the connection element and comprising
        a second structure of a second conducting material placed vertically between said first structure and said substrate and occupying a second region, and
        a third structure of a third conducting material placed vertically above said first structure and occupying a third region;
        said first region being confined within said second and third regions, said second and third structures being spot electrically connected together along peripheral portions thereof to laterally shield the connection element, and said second and third structures being electrically insulated from said first structure and from the substrate.

27. A method according to claim 26, wherein said first, second and third structures are generally planar.

28. A method according to claim 26, wherein said first, second and third regions are generally flat.

29. An integrated shielded electrical connection on a substrate and comprising:
    a connection element including a first structure of a first conducting material placed vertically above and isolated from the substrate and occupying a first region; and
    a shielding element comprising
        a second structure of a second conducting material placed vertically between said first structure and said substrate and occupying a second region, and
        a third structure of a third conducting material placed vertically above said first structure and occupying a third region;
        said first region being confined within said second and third regions, said second and third structures being electrically connected together, said second and third structures being electrically insulated from said first structure and from the substrate, and at least one of the first, second and third conducting materials comprising polysilicon and at least one other of the first, second, and third conducting materials comprising metal.

30. An integrated shielded electrical connection according to claim 29, wherein said first, second and third structures are generally planar.

31. An integrated shielded electrical connection according to claim 29, wherein said first, second and third regions are generally flat.

32. An integrated shielded electrical connection according to claim 29, wherein said second and third structures are contacted together along peripheral portions thereof to laterally shield said connection element.

33. An integrated shielded electrical connection according to claim 32, wherein said second and third structures are spot contacted together.

34. An integrated shielded electrical connection according to claim 29, wherein said second conducting material comprises polysilicon, and wherein said first and third conducting materials comprise a metal.

35. An integrated shielded electrical connection according to claim 29, further comprising at least one other connection element including a fourth structure made of said first conducting material being aligned with said first structure and occupying a fourth region; wherein said fourth region is confined within said second and third regions and extends outside said first region; and wherein said fourth structure is electrically insulated from said first, second, and third structures.

36. An integrated shielded electrical connection according to claim 35, wherein said connection elements are shielded laterally from one another.

37. An integrated shielded electrical connection according to claim 29, further comprising contacting zones wherein an edge of a corresponding region to a connection element matches an edge of one of said second and third regions.

* * * * *

UNITED STATES PATENT AND TRADEMARK OFFICE
CERTIFICATE OF CORRECTION

PATENT NO. : 6,133,621
DATED : October 17, 2000
INVENTOR(S) : Maurizio Gaibotti, Marco Costanzo, Francesco Sorrentino It is certified that error appears in the above-identified patent and that said Letters Patent is hereby corrected as shown below:

ON THE TITLE PAGE
Item

[30] Foreign Application Priority Data          insert--EP 98830613.0 October 15, 1998--

Signed and Sealed this

Eighth Day of May, 2001

Attest:

NICHOLAS P. GODICI

Attesting Officer          Acting Director of the United States Patent and Trademark Office